United States Patent
Zhang et al.

(10) Patent No.: US 6,255,705 B1
(45) Date of Patent: Jul. 3, 2001

(54) PRODUCING DEVICES HAVING BOTH ACTIVE MATRIX DISPLAY CIRCUITS AND PERIPHERAL CIRCUITS ON A SAME SUBSTRATE

(75) Inventors: Hongyong Zhang; Masayuki Sakakura; Futoshi Ishii, all of Kanagawa (JP)

(73) Assignee: Semiconductor Energy Laboratory Co., Ltd., Kanagawa (JP)

( * ) Notice: Subject to any disclaimer, the term of this patent is extended or adjusted under 35 U.S.C. 154(b) by 0 days.

(21) Appl. No.: 09/158,801

(22) Filed: Sep. 22, 1998

(30) Foreign Application Priority Data

Sep. 23, 1997 (JP) .................................................. 9-276574

(51) Int. Cl.[7] ........................ H01L 29/76; H01L 29/94; H01L 31/062; H01L 31/113; H01L 31/119
(52) U.S. Cl. ........................ 257/412; 257/368; 257/72; 257/413; 257/290; 257/291; 257/66; 349/42; 349/43; 349/46
(58) Field of Search ........................... 257/412, 413, 257/272, 274, 290, 291, 368, 66, 69, 72, 59, 221, 249, 250, 288, 335, 344, 443, 444, 388, 293; 349/42, 43, 46

(56) References Cited

U.S. PATENT DOCUMENTS

| | | | |
|---|---|---|---|
| 4,891,326 | * | 1/1990 | Koyanagi ............................... 437/29 |
| 5,214,298 | * | 5/1993 | Yuan et al. ............................. 257/194 |
| 5,373,170 | * | 12/1994 | Pfiester et al. ......................... 257/69 |
| 5,567,642 | * | 10/1996 | Kim et al. ............................... 437/57 |
| 5,625,217 | * | 4/1997 | Chau et al. ............................ 257/412 |
| 5,789,762 | * | 8/1998 | Koyama et al. ........................ 257/66 |
| 5,856,689 | * | 1/1999 | Suzawa .................................. 257/296 |
| 5,877,513 | * | 3/1999 | Koyama et al. ........................ 257/66 |
| 5,904,514 | * | 5/1999 | Konuma et al. ....................... 438/165 |
| 5,981,320 | * | 11/1999 | Lee ......................................... 438/199 |
| 6,055,034 | * | 4/2000 | Zhang et al. ........................... 349/51 |
| 6,153,445 | * | 11/2000 | Yamazaki et al. ..................... 438/30 |

FOREIGN PATENT DOCUMENTS

| | | | | |
|---|---|---|---|---|
| 56-19671 | * | 2/1981 | (JP) | ..................... 257/412 |
| 62-92470 | * | 4/1987 | (JP) | ..................... 257/412 |
| 5-36913 | * | 2/1993 | (JP) | ..................... 257/412 |
| WO 81/02222 | * | 8/1981 | (WO) | ..................... 257/412 |

* cited by examiner

Primary Examiner—Eddie C. Lee
Assistant Examiner—Jesse A Fenty
(74) Attorney, Agent, or Firm—Fish & Richardson P.C.

(57) ABSTRACT

Disclosed is a small-sized, power-saving and high-performance semiconductor integrated circuit that comprises first and second transistors formed on a substrate, wherein the gate electrode in the first transistor is of crystalline silicon, and the gate electrode in the second transistor is of a combination of crystalline silicon and a substance having a higher electric conductivity than said crystalline silicon as provided on at least a part of said crystalline silicon. In the circuit, the gate electrode in the first transistor is required to be patterned in fine patterns, while that in the second transistor is required to have low electric resistance. Such different types of gate electrodes are formed on one and the same substrate in a simple process. The elements constituting the circuit all have high quality.

74 Claims, 6 Drawing Sheets

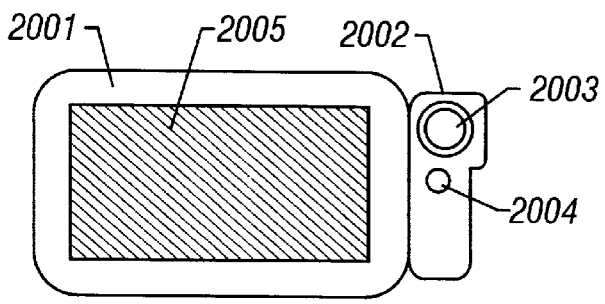
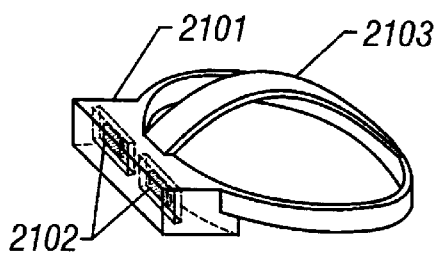
FIG. 5A
FIG. 5B
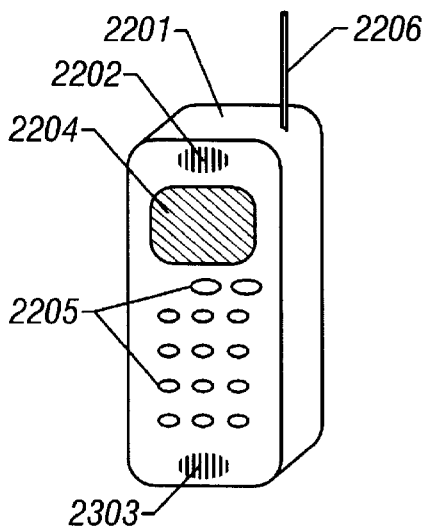
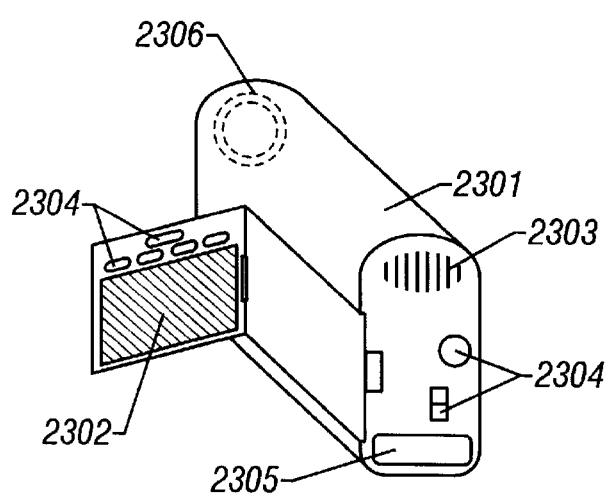
FIG. 5C
FIG. 5D
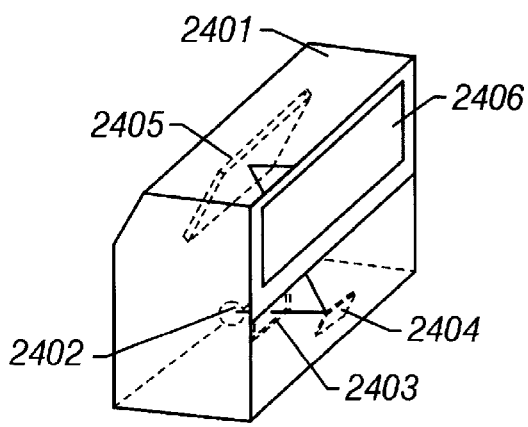
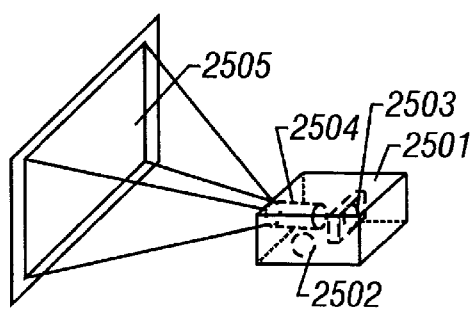
FIG. 5E
FIG. 5F

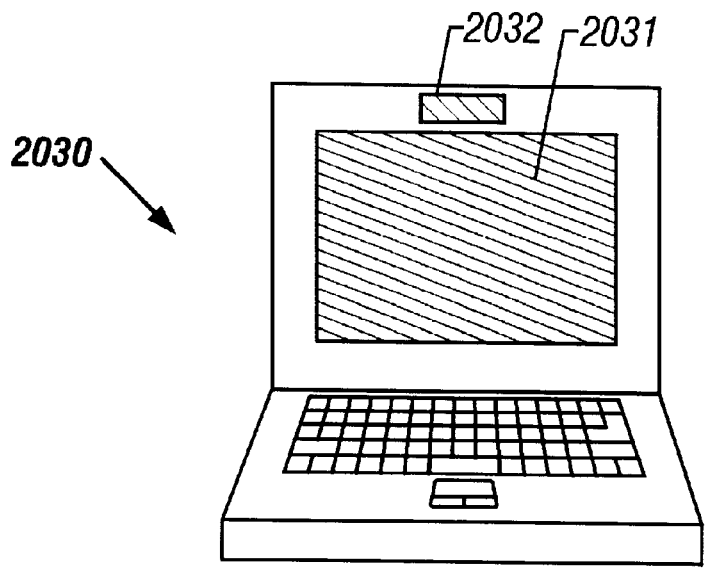
FIG. 6A
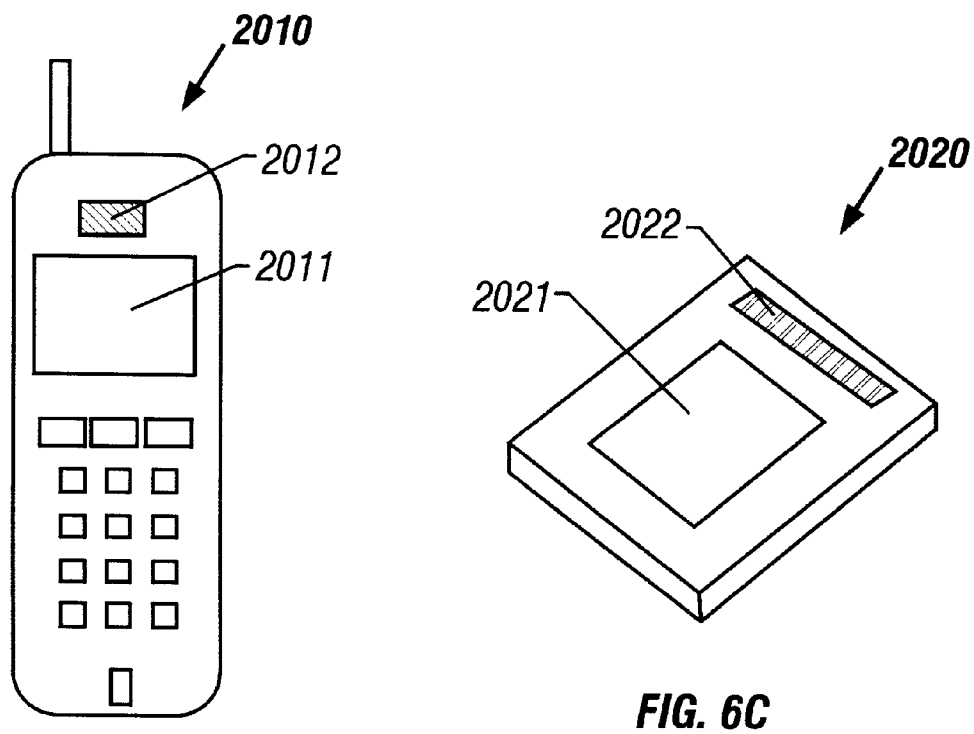
FIG. 6B
FIG. 6C

PRODUCING DEVICES HAVING BOTH ACTIVE MATRIX DISPLAY CIRCUITS AND PERIPHERAL CIRCUITS ON A SAME SUBSTRATE

FIELD OF THE INVENTION

The invention disclosed herein relates to a gate electrode of thin film transistors that constitute a semiconductor integrated circuit as formed on a substrate having an insulating surface.

The invention also relates to a semiconductor integrated circuit device having a plurality of different integrated circuits as formed on one and the same substrate.

The invention also relates to a peripheral circuits-integrated, electro-optical display device having active matrix-type display circuits and other peripheral circuits of peripheral driver circuits, image sensors and others all formed on one and the same substrate.

BACKGROUND OF THE INVENTION

Various electro-optical display devices such as liquid-crystal display devices, EL (electroluminescent) display devices and others that comprise active matrix-type display circuits have been being much developed in recent years.

The active matrix-type display circuit comprises a plurality of TFT (thin film transistors) for each pixel, and its driving system is such that each TFT for each pixel therein is switched for displaying the intended image.

Recently, in addition, peripheral circuits-integrated, electro-optical display devices such as liquid-crystal display devices, EL (electroluminescent) display devices and others that comprise a plurality of TFT have been being much developed, in which active matrix-type display circuits and peripheral circuits of TFT are formed on one and the same substrate having an insulating surface. In those, each TFT comprises an active layer of crystalline silicon. The crystalline silicon is characterized by its crystal structure, and includes microcrystalline silicon, polycrystalline silicon, semi-amorphous silicon (this indicates a mixed condition of silicon composed of microcrystalline, polycrystalline and amorphous silicons), and single-crystal silicon.

Peripheral circuits-integrated, electro-optical display devices have the advantages of low production cost, high integration, small size and high function, as compared with conventional devices to be produced by mounting peripheral circuits on a substrate previously having active matrix-type display circuits thereon, through TAB connection or COG connection.

At present, as the peripheral circuits in those peripheral circuits-integrated, electro-optical display devices, essentially disposed are shift register circuits, decoder circuits, level-shifting circuit, etc. The quality of crystalline silicon films for those peripheral circuits has been much improved in recent years, and the peripheral circuits comprising such improved crystalline silicon films have extremely excellent properties of high-speed operation.

In the active matrix-type driver circuit, signals are supplied all at a time to each row or each column. In this, therefore, wiring patterns (scanning lines, signal lines) common to each TFT of each row or column are disposed, and these are connected with the source or the gate of TFT.

The size of the active matrix display circuit in an electro-optical display device reaches from a few inches to tens inches in terms of the diagonal width. In the device, therefore, the scanning lines and the signal lines through which signals are supplied to each pixel TFT have an extremely large length of from a few cm to tens cm, though having an extremely small width of from a few $\mu$m to tens $\mu$m, and such a large length of those lines is quite inconceivable in LSI and others comprising single-crystal silicon substrates.

Since the active matrix display circuits in electro-optical display devices comprise such thin and long wiring patterns, the gate electrodes therein which are not required to pass a large current therethrough in an electric field applied thereto (these are of wiring patterns for switching the gate of each TFT) will often produce serious problems of delay and attenuation of driving signals due to the electric resistance of the wiring patterns for them.

Accordingly, as the substance to constitute the gate electrodes in those circuits, used is a metal having a low electric resistance, such as aluminum, tantalum, molybdenum, tungsten, copper or the like so as to prevent the delay and attenuation of driving signals.

However, it is difficult to work metal lines into fine wiring patterns having a line width of not larger than 1 $\mu$m or so.

For example, when aluminum is patterned according to a fine design rule to give fine wiring patterns having a width of not larger than 1 $\mu$m or so, the morphology of large crystal grains of aluminum appears around the wiring patterns formed, since the crystal grains of aluminum have a large grain size of hundreds nm or more. Therefore, linear patterning of aluminum is often impossible.

In addition, wiring patterns of aluminum as formed according to such a fine design rule are often cut due to cracks of the crystal grains of aluminum, since the aluminum crystal grains are too large relative to the line width of the patterns formed. If so, the reliability of the wiring patterns is greatly lowered.

On the other hand, there are commercially-available LSI comprising single-crystal silicon substrates, which have fine wiring patterns as formed according to the established design rule for 0.35 $\mu$m wiring patterns, and have an increased degree of integration.

In LSI comprising single-crystal silicon substrates, the gate electrodes are formed from a material of conductive crystalline silicon (or silicide), to which is added an impurity such as phosphorus or the like for the purpose of making the gate electrode have monoconductivity. The gate electrodes of such crystalline silicon may be patterned into fine patterns having a width of not larger than 1 $\mu$m, for example, 0.1 $\mu$m or so, though their electric resistance is higher by 10 times or more than that of metal electrodes.

The gate electrodes are for switching the gates ON in an electric field applied thereto. Therefore, they are not required to have low electric resistance, as compared with the wiring patterns to be connected with sources and drains for passing an electric current therethrough. For these reasons, in LSI-class integrated circuits comprising single-crystal silicon substrates and having short wiring patterns formed thereon, the gate electrodes may be formed from a material of crystalline silicon (or silicide).

The gate electrodes of crystalline silicon may be thinned, and transistors comprising such thin gate electrodes can be small-sized. Using such small-sized transistors realizes large-scale integrated circuits.

In addition, since the width of the gate electrodes can be narrowed, the driving voltage (source/drain voltage) of TFT can be lowered. As a result, the power to be consumed by TFT is reduced.

However, if crystalline silicon is used to form the gate electrodes in active matrix display circuits for large-sized displays, it causes the delay and attenuation of signals, since its electric conductivity is low but its electric resistance is high. If so, good displays could not be obtained.

For these reasons, in the conventional, peripheral circuits-integrated, electro-optical display devices, the gate electrodes are made of a metal not only in the active matrix display circuits but also in the peripheral circuits. Above all, widely used is aluminum or a material consisting essentially of aluminum for forming the gate electrodes, because of their high electric conductivity, excellent workability and stain resistance.

Therefore, in the conventional peripheral circuits-integrated, electro-optical display devices, only peripheral circuits that are relatively simple and have a low degree of integration, such as shift registers, decoders and the like, are formed on one and the same substrate on which are formed the active matrix display circuits, but the other peripheral circuits are attached to the substrate in an additional working process.

Needless-to-say, more complicated peripheral circuits composed of a large number of elements could be constructed, even when a metal is used for forming the gate electrodes therein. In that case, however, the area of the peripheral circuits on the substrate shall be enlarged, since the metal gate electrodes have a large line width of a few μm or more. If so, the devices shall be large-sized, and the power to be consumed by the devices increases.

In peripheral circuits-integrated, electro-optical display devices, the gate electrodes of TFT constituting the active matrix display circuits are required to have low electric resistance while those constituting the peripheral circuits are required to be in fine patterns.

However, known is no substance for such gate electrodes capable of satisfying the both requirements. For all that, if the gate electrodes are so differentiated in a simple manner that those of TFT constituting the active matrix display circuits are made of a metal while those of TFT constituting the peripheral circuits are made of crystalline silicon, such results in a great increase in the number of working steps for separately forming the two types of such gate electrodes, while causing the increase in the production costs. As a result, the advantage of forming peripheral circuits-integrated devices will be lost.

In addition, the present applicant has found that, when the gate electrodes are so differentiated as above, there occurs another problem that the properties of TFT elements comprising the thus-differentiated gate electrodes are worsened. Precisely, in the TFT elements comprising them, the threshold voltage fluctuates, the S value is lowered, and the degree of mobility is lowered, and, in addition, the reliability of the TFT elements themselves is lowered.

This problem is remarkable especially in top-gate-type TFT.

FIG. 4(A) to FIG. 4(C) show a general process for forming crystalline silicon gate electrodes and metal gate electrodes. In those, the left-handed part indicates a TFT having crystalline silicon gate electrodes, and the right-handed part indicates a TFT having a metal gate electrode.

Where crystalline silicon gate electrodes and metal gate electrodes are separately formed on one and the same substrate, the former shall be formed first. This is because crystalline silicon gate electrodes must be formed at higher temperatures than metal ones, and have higher heat resistance than the latter.

As in FIG. 4(A), an underlying film 402 is formed on a substrate 401; active layers 403 and 404 of silicon are formed on the subbing film 402; and an insulating film 405 of silicon oxide or the like, which is to be a gate-insulating film, is formed on the active layers 403 and 404. A crystalline silicon film 406, which is to be patterned into gate electrodes, is formed on the insulating film 405 through LPCVD.

Next, the crystalline silicon film 406 is patterned into crystalline silicon gate electrodes 407 for two TFT.

In this step, in the part in which metal gate electrodes are to be formed, the crystalline silicon film on the insulating film for the active layer 404 is entirely etched away.

The etching may be effected by any mode of dry etching or wet etching. Anyhow, however, the upper surface 408 of the insulating film 405, which is to be a gate-insulating film, is much roughened in the etching step.

In particular, in dry etching which is generally employed in the art, the insulating film is electrically charged by the plasma for etching, and trap levels would be formed. In addition, even the surface of the active layer 404 of silicon that underlies the insulating film 405 will often be roughened.

As a result, when a metal gate electrode 409 is formed in a later step, on the insulating film 405 that acts as a gate-insulating film, the interfacial characteristics between the gate-insulating film and the gate electrode will be poor, resulting in that the properties of TFT thus formed are also poor. Precisely, in the TFT formed, the threshold voltage fluctuates, the S value is lowered, and the degree of mobility is lowered. As the case may be, the TFT formed will have latent negative factors of such poor properties, while expressing them with the lapse of time. In that case, the TFT could not have long-lasting reliability.

SUMMARY OF THE INVENTION

Taking the problems in the prior art noted above into consideration, we, the present inventors have made the present invention disclosed herein. The subject matter of the invention is to realize the technique for producing semiconductor integrated circuits for electro-optical devices having both active matrix display circuits and peripheral circuits on one and the same substrate, in a simplified process comprising a reduced number of working steps. The semiconductor integrated circuit of that type is composed of a circuit where gate electrodes are required to have low electric resistance and a circuit where gate electrodes are required to be in fine patterns, in which the both circuits are formed on one and the same substrate. Accordingly, the object of the invention is to produce small-sized, power-saving, high-performance semiconductor integrated circuits in a simplified process, in which the elements of the circuits produced all have good properties.

Specifically, the invention is to provide a peripheral circuits-integrated, electro-optical display device having active matrix display circuits capable of displaying good images and power-saving peripheral circuits of large-scale integration, all formed on one and the same substrate.

In order to attain the object noted above, one aspect of the present invention is to provide a semiconductor integrated circuit comprising first and second transistors formed on a substrate, wherein;

the gate electrode in said first transistor is of crystalline silicon, and the gate electrode in said second transistor is of a combination of crystalline silicon and a substance having a higher electric conductivity than said crystalline silicon as provided on at least a part of said crystalline silicon.

In this constitution, the substance having a higher electric conductivity than crystalline silicon may be a metal or a substance consisting essentially of a metal.

Preferably, the thickness of the crystalline silicon layer of the gate electrode in the first transistor is almost the same as that of the crystalline silicon layer of the gate electrode in the second transistor.

Also preferably, the width of the gate electrode in the second transistor is larger than that of the gate electrode in the first transistor.

Still preferably, in the first and second transistors, side wall spacers are provided around the side wall of each gate electrode, and an LDD region that corresponds to the size of the bottom of each side wall spacer is formed; and the length of said side wall spacer in the direction of the channel length is larger in said second transistor than in said first transistor.

In the second transistor, crystalline silicon and the substance having a higher electric conductivity than said crystalline silicon may be patterned nearly in the same pattern for at least a part of the gate electrode.

In the second transistor, preferably, crystalline silicon and the substance having a higher electric conductivity than said crystalline silicon are both patterned nearly in the same pattern for the entire gate electrode.

Also preferably, crystalline silicon and the substance having a higher electric conductivity than said crystalline silicon are both patterned nearly in the same pattern for the gate electrode at least above the channel-forming region.

Another aspect of the invention disclosed herein is a semiconductor integrated circuit comprising first and second circuits formed on one and the same substrate, wherein;

said first and second circuits each have a plurality of transistors, the plural transistors constituting said first circuit each have a gate electrode of crystalline silicon, the plural transistors constituting said second circuit each have a gate electrode of a combination of crystalline silicon and a substance having a higher electric conductivity than said crystalline silicon as provided on at least a part of said crystalline silicon, and the width of the gate electrode in said first circuit is smaller than that of the part of the gate electrode capable of being formed from said substance having a higher electric conductivity in said second circuit.

In this constitution, preferably, the driving voltage for the second circuit is higher than that for the first circuit.

Also preferably, the second circuit is an active matrix display circuit, and the first circuit is a peripheral circuit for said active matrix display circuit.

Still preferably, said peripheral circuit is an area image sensor circuit.

The crystalline silicon employed herein contains an impurity capable of imparting conductivity thereto. The conductivity-imparting impurity is a 3-valent or 5-valent impurity, such as phosphorus, boron or the like.

The invention disclosed herein is a semiconductor integrated circuit comprising a circuit where the gate electrodes are required to have low electric resistance and a circuit where the gate electrodes are required to be in fine line-like patterns.

Specifically, the constitution of the semiconductor integrated circuit of the invention is characterized in that;

in TFT or TFT-containing circuits, such as active matrix display circuits where the gate electrodes are required to have low electric resistance, the gate electrodes are so constructed that a substance having a high electric conductivity, such as a metal or a substance consisting essentially of a metal, is provided on a layer of crystalline silicon that contains a conductivity-imparting impurity, and in the other TFT or TFT-containing circuits, such as shift registers, control circuits, MPU, area image sensors, memory circuits and others where the gate electrodes are required to be patterned in fine patterns, the gate electrodes are formed from crystalline silicon that contains a conductivity-imparting impurity, like in conventional LSI.

The semiconductor integrated circuit of the invention having the specific constitution noted above can be produced in a simplified process that comprises a reduced number or working steps, in which gate electrodes capable of being patterned in fine patterns and gate electrodes having low electric resistance are formed on one and the same substrate.

In the invention, a metal or a substance consisting essentially of a metal may be used as the substance having a higher electric conductivity than crystalline silicon that contains a conductivity-imparting impurity, and this is applied onto the layer of crystalline silicon that contains a conductivity-imparting impurity, to form a gate electrode. In this constitution, the resistance depression in the gate electrode having a metal or metallic substance on the layer of crystalline silicon does not produce any significant problem, and the electric resistance (in terms of the sheet resistance ($\omega/cm^2$)) of the gate electrode could be from 1/a few times to 1/tens times that of the gate electrode of crystalline silicon.

The process for producing the circuit structure of the invention does not differ so much from the conventional process for forming crystalline silicon gate electrodes on a substrate, and the former shall have some minor additional working steps, as compared with the latter. In other words, the process for the invention substantially requires few additional working steps.

In addition, the process for the invention does not require etching removal of the crystalline silicon film overlying the channel-forming region, and therefore, this does not cause any substantial roughening of the upper surface of the gate-insulating film. Accordingly, in the process, the interface between the gate electrode and the gate-insulating film is kept well, and TFT having excellent characteristics are obtained.

Where LDD regions are provided in the circuit of the invention, the thickness of the gate electrode in the TFT in which the gate electrode is composed of a layer of crystalline silicon and a substance having a higher electric conductivity as formed on the crystalline silicon layer shall be larger than that of the gate electrode in the crystalline silicon gate-having TFT, by the thickness of the substance having a higher electric conductivity in the former. In the constitution of that type, side wall spacers may be formed around the side walls of the gate electrodes. In this, the length of each side wall spacer in TFT may be varied in a self-aligned manner in the direction of the channel length. A plurality of such TFT may be formed on one and the same substrate in one step.

According to the present invention disclosed herein, it is easy to produce a semiconductor integrated circuit that comprises a circuit where the gate electrodes are required to have low electric resistance and a circuit where the gate electrodes are required to be patterned in fine patterns, both formed on one and the same substrate, and, in addition, it is easy to obtain a small-sized, power-saving, high-performance semiconductor integrated circuit of large-scale integration that comprises high-quality transistors.

BRIEF DESCRIPTION OF THE DRAWINGS

FIG. 5(A) to FIG. 5(F) show some applications of the invention disclosed herein.

FIG. 6(A) to FIG. 6(C) show other applications of the invention disclosed herein.

In FIG. 1(A) to FIG. 1(E), 101 is a substrate; 102 is an underlying film; 108 is a crystalline silicon gate; 109 is a crystalline silicon gate; 112 is a crystalline silicon layer; 113 is a layer of a metal or a substance consisting essentially of a metal; 117, 118 and 119 are side wall spacers; 128, 129 and 130 are LDD regions; 150 is a metal-silicon gate electrode; 151 is a TFT having a crystalline silicon gate electrode; 152 is a TFT having a crystalline silicon gate electrode; and 153 is a TFT having a metal-silicon gate electrode.

DESCRIPTION OF PREFERRED EMBODIMENTS OF THE INVENTION

The invention disclosed herein is described in more detail with reference to the following Examples, which, however, are not intended to restrict the scope of the invention.

EXAMPLE 1

FIG. 1(A) to FIG. 1(E) show a process for producing the semiconductor integrated circuit of Example 1.

In Example 1, produced is an active matrix substrate (this is a substrate having an active matrix-type liquid-crystal display circuit formed thereon) for a peripheral circuits-integrated active matrix-type liquid-crystal electro-optical display device.

Figure 1A:
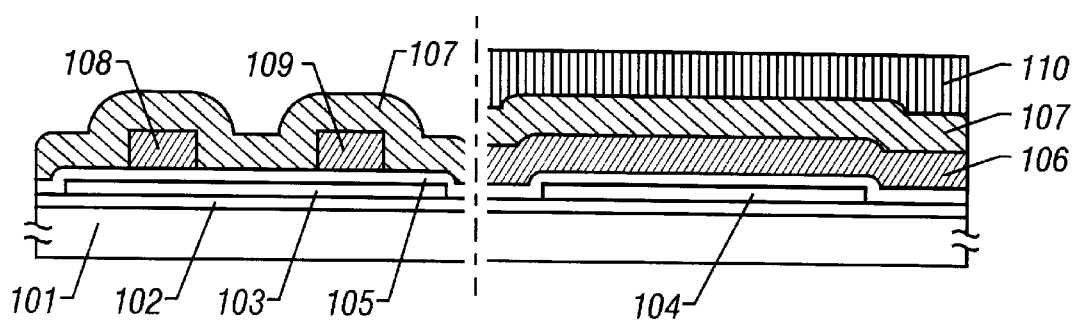
FIG. 1(A) to FIG. 1(E) show a process for producing the device of Examples 1 and 2.
Figure 1B:
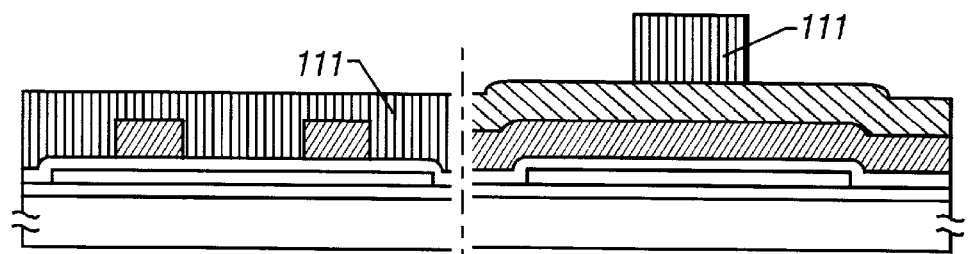
Figure 1C:
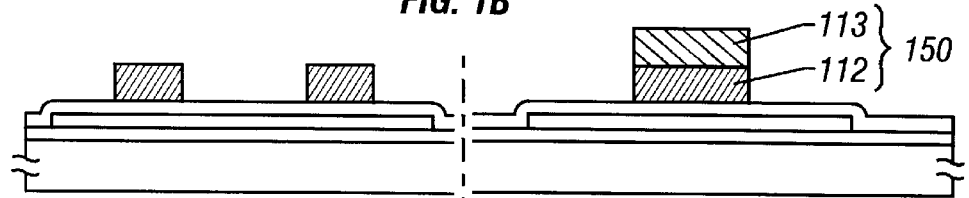
Figure 1D:
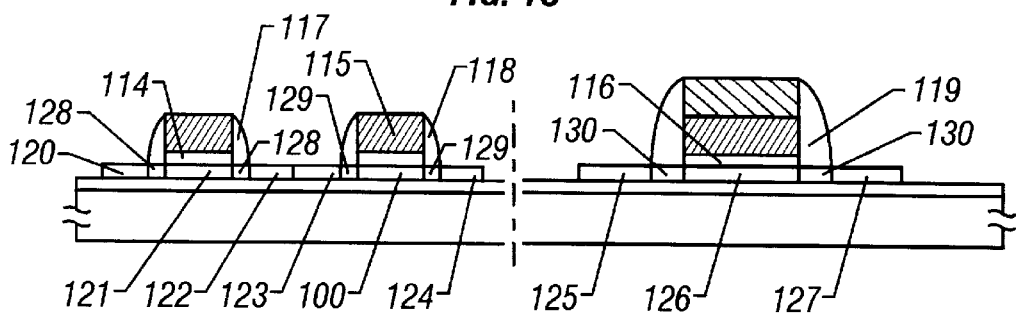
Figure 1E:
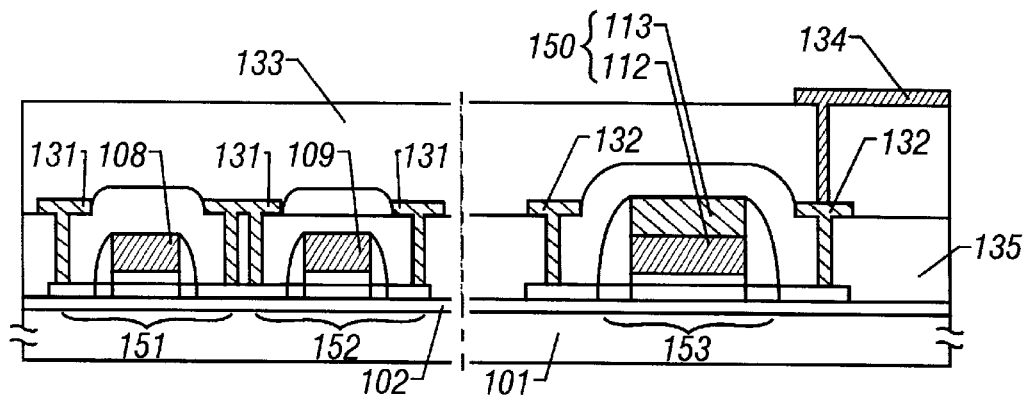

FIG. 1(E) shows the constitution of the active matrix substrate of this Example. The numeral references in FIG. 1(D) are referred to also in FIG. 1(E).

This Example is to demonstrate one embodiment comprising TFT 151, 152 and 153, in which TFT 153 is a pixel switching element in an active matrix display circuit, and TFT 151 and 152 are peripheral circuits for driving the active matrix display circuit, such as a shift register, etc.

As in FIG. 1(E), TFT (thin film transistors) 151, 152 and 153 are provided on the substrate 101 having an insulating surface, optionally via an underlying film 102 therebetween.

The gate electrodes 108 and 109 in TFT 151 and 152 are of conductive crystalline silicon containing a conductivity-imparting impurity. The gate electrodes of this type are hereinafter referred to as crystalline silicon gate electrodes.

On the other hand, the gate electrode 150 of TFT 153, which is required to have low electric resistance, is composed of a layer 112 of conductive crystalline silicon and a layer 113 of a substance having high electric conductivity. In this Example, the layer 113 is of a metal or a substance consisting essentially of a metal. The gate electrode of this type is hereinafter referred to as a metal-silicon gate electrode.

In this Example, TFT 151 is a P-channel type one, and TFT 152 is an N-channel type one, and these form a complementary (CMOS) structure.

If desired, side wall spacers 117, 118 and 119 may be provided around the side walls of the gate electrodes 109, 109 and 150 for the purpose of forming LDD regions 128, 129 and 130 in the active layers.

TFT 151 is so constructed that the crystalline silicon gate electrode 108 is formed on the active layer via a gate-insulating film 114 therebetween, in which a source region 120, a channel-forming region 121 and a drain region 122 are formed in the active layer.

TFT 152 is so constructed that the crystalline silicon gate electrode 109 is formed on the active layer via a gate-insulating film 115 therebetween, in which a source region 123, a channel-forming region 100 and a drain region 124 are formed in the active layer.

In TFT 151 and 152, source electrodes and drain electrodes 131 are provided via a first interlayer insulating film 135 therebetween.

TFT 153 is so constructed that the metal-silicon gate electrode 150 is formed on the active layer via a gate-insulating film 116 therebetween, in which a source region 125, a channel-forming region 126 and a drain region 127 are formed in the active layer.

In TFT 153, source and drain electrodes 132 are provided via the first interlayer insulating film 135 therebetween, one of which is connected with a pixel electrode 134 via a second interlayer insulating film 133 therebetween. In this, the pixel electrode 134 is for driving liquid crystals.

The thickness of the crystalline silicon gate electrodes 108 and 109 may fall between 200 nm and 800 nm, but preferably between 30 nm and 500 nm. For example, it may be 400 nm.

The width of the crystalline silicon gate electrodes 108 and 109 (that is, the length thereof in the direction of the channel length) may be smaller than that of the metal-silicon gate electrode 150. In this Example, the former may fall between 0.1 $\mu$m and 4 $\mu$m, but preferably between 0.1 $\mu$m and 2 $\mu$m. For example, it may be 0.5 $\mu$m.

In TFT 153, the layer 113 of a metal or a substance consisting essentially of a metal may be any of aluminum, tantalum, molybdenum, tungsten, titanium, copper or the like metal. It may also be of a mixture consisting essentially of at least one of those metals and containing any other metal of silicon, tungsten and the like. If desired, the layer 113 may be of a laminate film of different metals, such as titanium/aluminum/titanium or the like so as to have improved contact characteristics.

The crystalline silicon gate electrodes 108 and 109 in TFT 151 and 152 could be patterned in fine patterns of sub-micron orders (not larger than 1 $\mu$m), as they are of crystalline silicon. Accordingly, using those TFT 151 and 152 may produce peripheral circuits having a high degree of integration.

On the other hand, the metal-silicon gate electrode 150 in TFT 153 is of a laminate comprising a layer of a metal or a substance consisting essentially of a metal. Therefore, the gate 150 must be patterned to have a line width of a few $\mu$m, for example, not smaller than 2 $\mu$m, in order to ensure the reliability of TFT. In other words, the gate electrode 150 is not suitable to fine patterning on a sub-micron level. However, the electric conductivity of the gate electrode 150 is from a few times to tens times that of a gate electrode of crystalline silicon or silicide, and the sheet resistivity of the former could be lowered to be from 1/a few times to 1/tens times that of the latter.

Accordingly, where gate electrodes of that type are used in TFT for pixel switching (pixel TFT) in a large-area active matrix display circuit, gate signals through the circuit may be prevented from being attenuated or delayed.

In this Example, the thickness of the conductive crystalline silicon 112 of the metal-silicon gate electrode 150 is the same as that of the crystalline silicon gate electrodes 108 and 109. The thickness of the layer 113, which is a metal or a substance consisting essentially of a metal, may fall between 100 nm and 600 nm, for example, may be 300 nm.

In this Example, the conductive crystalline silicon layer 112 and the layer 113, which is a metal or a substance consisting essentially of a metal, may have nearly the same pattern throughout the entire length of the metal-silicon gate electrode 150. This is because the two are patterned via one and the same mask.

Accordingly, in this Example, the conductive crystalline silicon layer 112 and the metal or metallic substance layer 113 may have nearly the same width anywhere in the direction of the length of the gate electrode 150. The width is not specifically defined so far as it falls within a patternable range. In this Example, the width is 5 μm.

Where the metal-silicon gate electrode 150 is so constructed that the conductive crystalline silicon layer 112 and the metal or metallic substance layer 113 overlying the layer 112 are patterned to have nearly the same pattern at least in the region above the channel-forming region in TFT, the side wall spacer 119 is favorably formed around the gate electrode 150. The side wall spacer 119 is for forming an LDD region in TFT.

The side wall spacer 119 may be formed by anisotropically etching an insulating film of silicon oxide or the like which is formed to cover the gate electrode 150. Therefore, the length of the side wall spacer thus formed varies in proportion to the height of the gate electrode 150 in the direction of the channel length.

Where the side wall of the metal-silicon gate electrode 150 is formed to have a flat vertical surface, the side wall spacer could be well formed therearound while being firmly adhered to the side wall, and, in addition, its height could be nearest to the height of the metal or metallic substance layer 113 of the upper layer of the metal-silicon gate electrode 150. In this case, therefore, the length of the side wall spacer in the direction of the channel length could be the largest. As a result, in this case, the intended LDD region could be formed accurately, and the length of the LDD region formed in the direction of the channel length could be larger.

Of the gate electrode 150 above the channel-forming region 126, if the width of the metal or metallic substance layer 113 of the upper layer is larger than that of the conductive crystalline silicon layer 112 of the lower layer, a void gap will be formed between the side wall of the lower layer 112 and the side wall spacer formed, resulting in that the shape of the side wall spacer formed will be disordered. If so, the LDD region could not be formed correctly below the side wall spacer.

However, even if the width of the upper layer is larger than that of the lower layer, the difference in the width between the two shall fall within the scope of "nearly the same pattern" as referred to herein for the two layers, so far as the side wall spacer is well formed in the intended manner, and so far as the LDD region is correctly formed below the side wall spacer formed.

Contrary to the case noted above, however, if the width of the lower layer is larger than that of the upper layer, the length of the side wall spacer to be formed around the gate electrode of this type in the direction of the channel length shall be shorter. In this case, therefore, the smallest length of the side wall spacer formed shall be the same as the length of the gate electrode of only the conductive crystalline silicone layer 112.

However, even if the width of the lower layer is larger than that of the upper layer, the difference in the width between the two shall fall within the scope of "nearly the same pattern" as referred to herein for the two layers, so far as the length of the side wall spacer formed around the gate electrode composed of the two layers is larger than that of the side wall spacer formed around the gate electrode of only the conductive crystalline silicon layer 112 in the direction of the channel length, or, in other words, so far as it is larger than the length of the side wall spacer 117 or 118.

Of the metal-silicon gate electrode 150, it is desirable that the conductive crystalline silicon layer 112 is formed of the same film as that for the crystalline silicon gate electrodes 108 and 109, so as to reduce the number of working steps for forming those electrodes. If so, the height (that is, the thickness) of the crystalline silicon gate electrodes 108 and 109 may be nearly the same as that of the conductive crystalline silicon later 112 of the metal-silicon gate electrode 150, though depending on the working step for forming them. In other words, the height of the metal-silicon gate electrode 150 shall be larger than that of the conductive crystalline silicon layer 112 by the height (thickness) of the metal or metallic substance layer 113 overlying the layer 112.

Accordingly, where the side wall spacer 119 is formed around the metal-silicon gate electrode 150 in a process comprising forming a known insulating film followed by anisotropically etching it, the length of the spacer 119 in the direction of the channel length is longer than that of the side wall spacer 117 or 118 as formed around the crystalline silicon gate electrode.

As a result, the length of the LDD region 130 in the direction of the channel length is longer than that of the LDD region 128 or 129. Accordingly, TFT 153 may have higher voltage resistance than TFT 151 and 152.

The constitution of this Example is characterized in that those plural LDD regions each having a different length in the direction of the channel length can be formed on one and the same substrate in one working step that is quite the same as the conventional working step of forming side wall spacers (and LDD regions).

For example, the voltage to be applied between the source and the drain in pixel-switching TFT in active matrix display circuits is higher than that for driving signals for peripheral circuits. Therefore, the voltage resistance of such pixel-switching TFT must be higher than that of TFT constituting peripheral circuits. For this, it is desired that the length of the LDD region in the direction of the channel length in the pixel-switching TFT is larger than that of the LDD region in TFT that constitute peripheral circuits. According to the embodiment of this Example of the invention, it is possible to realize the intended constitution in a self-aligned manner, without increasing the number of working steps necessary for producing it.

In the constitution of this Example, if desired, at least a part of the crystalline silicon gate electrodes 108 and 109 may be replaced with a metal silicide to thereby reduce the electric resistance of the electrodes and to improve the ohmic contact characteristics thereof.

Also if desired, the metal or metallic substance layer 113 of the gate electrode 150 may be subjected to anodic oxidation with a weak acid to form a dense oxide film (barrier-type oxide film) on its surface. The thickness of the oxide film may fall between 10 nm and 150 nm or so, for example, may be 50 nm. The oxide film improves the heat resistance of the metal or metallic substance layer 113, while preventing the formation of hillocks on the layer 113 in the later heating step.

In this Example that demonstrates one embodiment of the present invention, at least a part of the metal-silicon gate electrode 150 may have the metal or metallic substance layer 113 on the conductive crystalline silicon layer 112, whereby the electric resistance of the gate electrode 150 is reduced. Needless-to-say, where the gate electrode 150 is so constructed that the metal or metallic substance layer 113 entirely overlies the conductive crystalline silicon layer 112, the electric resistance of the gate electrode 150 could be minimized.

In the embodiment of this Example, where the metal-silicon gate electrode 150 is so constructed that the metal or metallic substance layer 113 overlies the conductive crystalline silicon layer 112 in such a manner that the two layers are patterned to have nearly the same pattern, the lowermost limit of the patternable width of the metal-silicon gate electrode 150 may be the same as the lowermost limit (for example, 1 $\mu$m) of the patternable width of the metal or metallic substance layer 113. In that case, therefore, the degree of integration and the fine workability of the structure of this embodiment are not lower or worse than those of the structure comprising conventional metal gate electrodes only. Accordingly, the metal-silicon gate electrode 150 in this embodiment could be finely patterned to the same degree as in conventional patterning for metal wiring.

The constitution of this Example, even when applied to a large-area active matrix display circuit having a size of from a few inches to tens inches in terms of the diagonal width, gives good images, while being accompanied by attenuation or delay of gate signals passing therethrough. In addition, as compared with conventional peripheral circuits-integrated IC devices where all gate electrodes are made of metal, the devices having the constitution of this Example are more advantageous in that the degree of integration of the peripheral circuits therein is increased. Accordingly, in the devices having the constitution of this Example, the area for the region not participating in displaying performance (so-called frame region) around the active matrix display region in the substrate can be reduced, resulting in that the devices could be small-sized.

Moreover, since the width of the gate electrodes in the peripheral circuits of the devices having the constitution of this Example could be realized according to the sub-micron rule, the devices could be driven at a low voltage of not larger than 5 V or so, and the power to be consumed by the devices is much reduced.

EXAMPLE 2

This Example 2 is to demonstrate the process for producing the active matrix substrate of Example 1. In FIG. 1(A) to FIG. 1(E), TFT 151 and 152 in the left-handed part have the crystalline silicon gate electrodes 108 and 109, respectively, and TFT 153 in the right-handed part has the metal-silicon gate electrode 150.

First prepared is the substrate 101 having an insulating surface. As the material of the substrate 101, usable is any of glass, quartz, ceramics, surface-oxidized single-crystal silicon or the like. Herein used is Corning 1737 glass.

On the insulating surface of the substrate 101, optionally formed is an underlying film 102 of silicon oxide through sputtering, plasma CVD or the like. The film 102 may have a thickness of from 100 nm to 200 nm, for example, 100 nm.

Next, a crystalline silicon film to be the active layers in TFT is formed in a known manner. This may have a thickness of from 30 nm to 300 nm, for example, 50 nm. The thus-formed crystalline silicon film is patterned into island regions 103 and 104, which are to be the active layers in TFT.

As the case may be, the crystallinity of the crystalline silicon film may be promoted by a catalyst element capable of promoting silicon crystallinity, such as nickel or the like. In that case, the crystalline silicon film will contain a minor amount of the catalyst element used.

Next, a silicon oxide film 105 to be a gate-insulating film is formed through plasma CVD, sputtering, thermal oxidation or the like. Its thickness may be from 50 nm to 300 nm. In this Example, the film 105 is formed to have a thickness of 100 nm.

To control the threshold value of the N-channel TFT, boron may be added to the crystalline silicon film to be the active layer in the N-channel TFT. In that case, it is desirable that the boron-containing active layer is activated through exposure to laser beams, heat, intense light or the like.

Next, a conductive crystalline silicon film to be gate electrodes is formed in the regions for both TFT. In this Example, the film is formed through LPCVD using raw material gasses of $SiH_4$ and $PH_3$, at 600° C. The film formed is an N-type crystalline silicon film containing an impurity element of phosphorus. Its thickness is from 200 nm to 800 nm, but preferably from 300 nm to 600 nm. In this Example, the thickness of the film is 400 nm.

As the impurity element, herein usable is any of 3-valent or 5-valent elements capable of imparting monoconductivity to the crystalline silicon film, such as phosphorus, boron or the like.

Alternatively, the crystalline silicon film may be formed without adding an impurity thereto, and thereafter this may be doped with a monoconductivity-imparting impurity element, such as phosphorus, through ion implantation. After the ion implantation, it is desirable that the film is activated through exposure to laser beams, heat or the like, whereby the crystallinity of the film could be restored.

Next, the crystalline silicon film is etched to form the crystalline silicon gate electrodes 108 and 109, and also the crystalline silicon film 106 for TFT 153 which is to have a metal-silicon gate electrode. For this, in this Example, the film is etched anisotropically through RIE (reactive ion etching) using $CH_4$ and $O_2$. The crystalline silicon film 106 may be such that it gives the metal-silicon gate electrode 150 in a later step.

Next formed is a metal film 107, which is to form the metal-silicon gate electrode 150. The metal film 107 may be of any metal including aluminum, tantalum, molybdenum, tungsten, titanium and the like, or of a substance comprising any of those metal elements, or may also be in the form of a laminate composed of a plurality of different metal or metallic substance films.

In this Example, formed is an aluminum film containing 2 wt. % of scandium, through sputtering. The film may have a thickness of from 200 nm to 600 nm, and the film formed herein has a thickness of 300 nm. Containing silicon or scandium, the aluminum film is prevented from having hillocks or voids that may be formed in the later heating step.

After the metal film 107 has been formed, it is optionally subjected to anodic oxidation with a weak acid to thereby form a dense oxide film (barrier-type oxide film) on its surface. It is especially desirable to subject the aluminum film to anodic oxidation to form a dense oxide film thereon, by which the heat resistance of the film is improved and the formation of hillocks on the surface of the film is prevented. The thickness of the oxide film may fall between 10 nm and 150 nm. In this Example, the oxide film has a thickness of 50 nm (not shown).

Next, a resist 110 is formed in the region in which TFT 153 having a metal-silicon gate electrode is to be formed. (FIG. 1(A))

Next, the metal film 107 is etched via the resist 110 that acts as a mask, whereby all the metal film in the region in which the crystalline silicon gate TFT 151 and 152 are to be formed is completely removed.

After this, a resist 111 is formed in the region in which the crystalline silicon gate TFT 151 and 152 are to be formed, and in the region in which the metal-silicon gate electrode 150 is to be formed. (FIG. 1(B))

Next, both the metal film 107 (aluminum film in this Example) and the crystalline silicon film 106 are etched and patterned all at a time, via the resist 111 that acts as a mask. In other words, both the aluminum film and the crystalline silicon film are etched all at a time via one and the same mask. Briefly, these films are etched through RIE using, as a reactive vapor mixture, $Cl_2/BCl_3/SiCl_4$.

As a result of this etching, formed is the metal-silicon gate electrode 150, which is composed of the conductive crystalline silicon layer 112 and the overlying layer 113 of a metal or a substance consisting essentially of a metal. In this, the both layers 112 and 113 are patterned to have nearly the same pattern. (FIG. 1(C))

In the process disclosed herein, both the metal film and the crystalline silicon film are etched all at a time to form the metal-silicon gate electrode 150. Therefore, the process is effective in producing the gate electrode 150 having a nearly vertical side wall, in which the side walls of the metal film and the crystalline silicon film are unified to be nearly vertical to the surface of the substrate. As the side walls of the two films constituting the gate electrode are unified in this process, the side wall spacer 119 to be formed in a later step is well controlled so as not to form any void gap between the gate electrode and the side wall spacer formed.

The invention disclosed herein is not limited to only the process illustrated hereinabove. Apart from the process illustrated in this Example, any other process capable of forming both the crystalline silicon gate electrodes and the metal-silicon gate electrodes on one and the same substrate is employable in the invention.

Next, the silicon oxide film 105 is etched via the gate electrodes 108, 109 and 150 all acting as masks, to form the gate-insulating films 114, 115 and 116.

Next formed are source and drain regions, for which is employed any known ion implantation via the gate electrodes acting as masks, in accordance with the intended conductivity. In this Example, the ion implantation is so effected that TFT 151 may be a P-channel one and TFT 152 and 153 may be N-channel ones.

In this Example, LDD regions (impurity-poor regions, light-doped drain regions) are formed. Accordingly, the entire active layer including the area to be the LDD regions in a later step is subjected to the first ion implantation via the gate electrodes 108, 109 and 150 all acting as masks. This first ion implantation is for light doping so as to make the doped active layer have a low impurity ion concentration ($n^-$, $p^-$).

Next, a silicon oxide film, a polycrystalline silicon film or the like, which is to be formed into side wall spacers, is formed, and then anisotropically etched. Thus are formed the side wall spacers 117, 118 and 119.

As so mentioned in Example 1, the length of the side wall spacer 119 as formed around the side wall of the gate electrode 150 is longer than that of the side wall spacers 117 and 118 as formed around the side walls of the gate electrodes 108 and 109, in the direction of the channel length. This is because the thickness (height) of the gate electrode 150 is larger than that of the gate electrodes 108 and 109 by the thickness (height) of the metal or metallic substance layer 113 existing in the former.

As a result, the LDD region to be formed below the side wall spacer 119 in a later step shall be longer than the LDD regions to be formed below the side wall spacers 117 and 118, in the direction of the channel length. Accordingly, the voltage resistance of TFT 153 is higher than that of TFT 151 and 152. The constitution illustrated herein can be realized in a self-aligned manner according to the present invention. The constitution illustrated is one characteristic feature of the invention, as so demonstrated in this Example.

Next, via the gate electrodes and the side wall spacers all acting as masks, the active layer is subjected to the second ion implantation for heavy doping so as to have a high impurity ion concentration ($n^+$, $p^+$). Naturally, this ion implantation shall be effected in some known manner to produce different TFT of N-channel TFT and P-channel TFT.

In this step, impurity ions are implanted into the crystalline silicon gate electrodes 108 and 109. Therefore, it is possible to intentionally add desired impurity ions to the electrodes in this step.

Next, the thus-doped active layer is annealed with laser beams or the like, whereby it is activated in the ion-implanted site. In this step, the crystalline silicon gate electrodes are also activated.

In that manner, formed are the source region 120, the channel-forming region 121, the drain region 122 and the LDD region 128 of the P-channel TFT 151 having the crystalline silicon gate electrode 108.

Also formed are the source region 123, the channel-forming region 100, the drain region 124 and the LDD region 129 of the N-channel TFT 152 having the crystalline silicon gate electrode 109.

Further formed are the source region 125, the channel-forming region 126, the drain region 127 and the LDD region 130 of TFT 153 (this is N-channel TFT in this Example) having the metal-silicon gate electrode 150. (FIG. 1(D))

Next, the first interlayer insulating film 135, the source/drain electrodes 131 and 132, the second interlayer insulating film 133 and the pixel electrode 134 are formed in some known method.

According to the process illustrated herein, formed are the crystalline silicon gate electrodes in TFT for peripheral circuits that are required to have fine patterns and are required to be power-saving, and the metal-silicon gate electrodes in TFT for active matrix display circuits that are required to have low electric resistance and are required to be highly resistant to voltage, all on one and the same substrate. (FIG. 1(E))

EXAMPLE 3

Figure 2A:
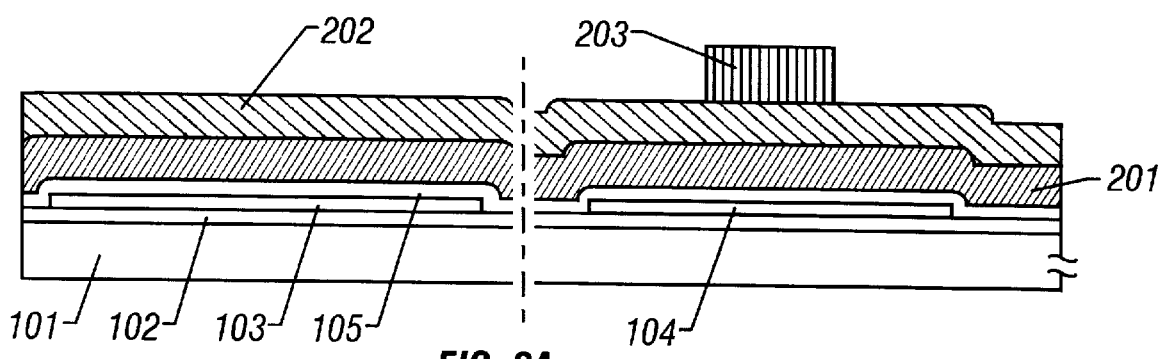
FIG. 2(A) to FIG. 2(C) show a process for producing the device of Example 3.
Figure 2B:
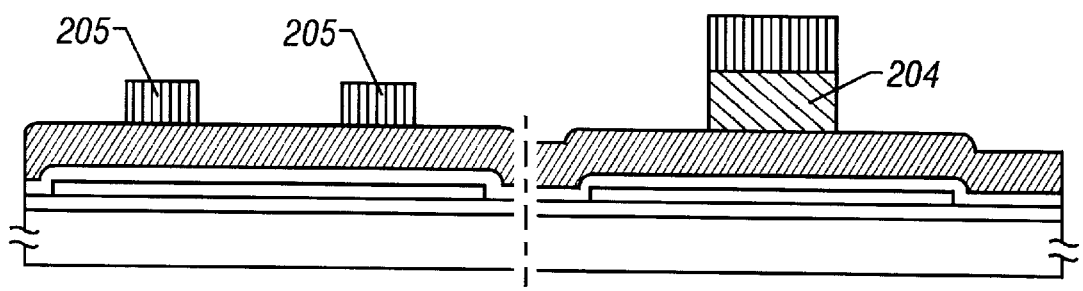
Figure 2C:
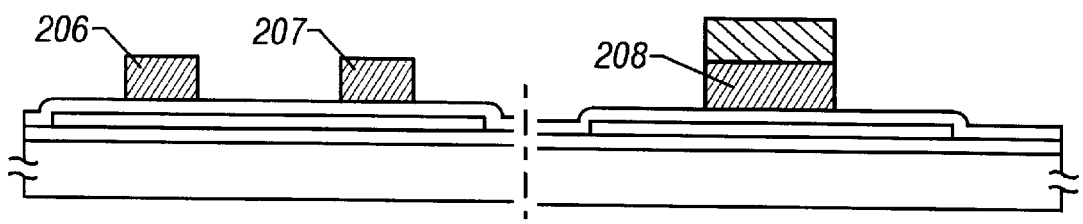

This Example is to demonstrate a modification of the process of Example 2, in which are formed crystalline silicon gate electrodes and metal-silicon gate electrodes on one and the same substrate. FIG. 2(A) to FIG. 2(C) are referred to herein. In those, the same numeral references as those in FIG. 1(A) to FIG. 1(E) have the same meanings as those in the latter. Unless otherwise specifically indicated herein, the same as in Example 2 shall apply to this Example 3.

In this Example, an insulating film 105 to be a gate-insulating film is formed, and thereafter a conductive crystalline silicon film 201 and a metal or metallic substance film 202 are formed over the film 105 in that order, in the same manner as in Example 2. Next, a resist 203 is formed in the region in which a metal-silicon gate electrode is to be formed. (FIG. 2(A))

Next, the metal or metallic substance film 202 (this is a film of aluminum containing 2 wt. % of scandium in this Example) is etched via the resist 203 acting as a mask.

For this, the film is wet-etched with a mixed acid of phosphoric acid, nitric acid and acetic acid (containing aluminum). Needless-to-say, it may be dry-etched.

Next, resists 205 are formed, which are for forming crystalline silicon gate electrodes. Then, the crystalline silicon film 201 is etched via the resists 205 and the patterned aluminum 204 all acting as masks.

In that manner, formed are crystalline silicon gate electrodes 206 and 207 and a metal-silicon gate electrode 208. The structure thus formed is thereafter processed in the same manner as in Example 2.

EXAMPLE 4

This Example is to demonstrate another embodiment of the invention for the constitution of an image sensor-integrated panel, in which are formed active matrix-type display circuits and area image sensor circuits on one and the same substrate.

Like active matrix display circuits, area image sensor circuits are active matrix circuits having pixel-switching TFT.

Where the picture size of the active matrix display circuit is 12 inches in terms of the diagonal width, the line width of the wiring patterns including gate electrodes may be 5 $\mu$m (5 $\mu$m rule). However, since the picture size is large, the gate electrodes must have low electric resistance so as to retard the gate signal delay.

On the other hand, the size of the area image sensor circuit falls between ¼ and ½ inches. Therefore, in order to realize the same pixel number in both circuits, the line width of the wiring patterns in the area image sensor circuit must be 1 $\mu$m (1 $\mu$m rule). However, in the area image sensor circuit, there occurs no problem of gate signal delay. Therefore, it is unnecessary to use gate electrodes having low electric resistance in the area image sensor circuit.

The constitution to be illustrated in this Example satisfies the requirements on a high level.

Figure 3A:
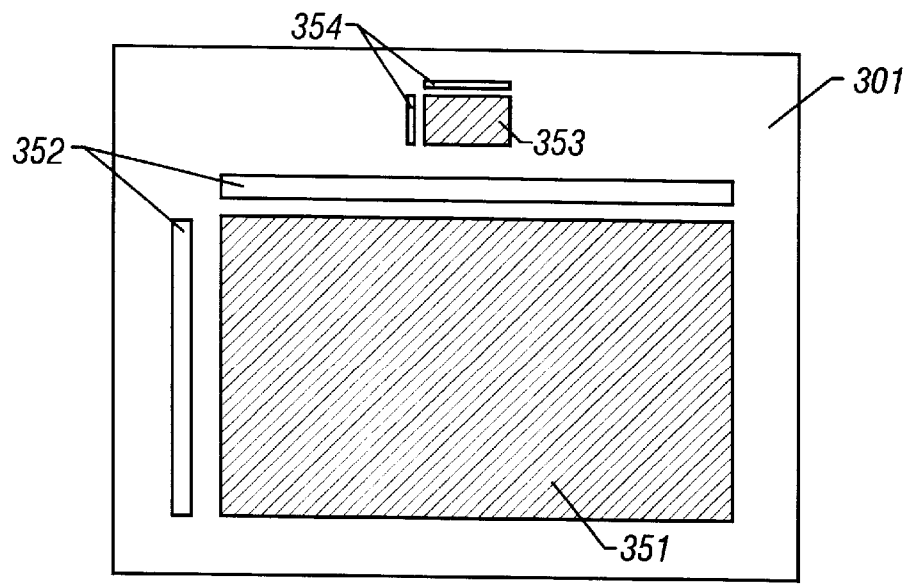
FIG. 3(a) and FIG. 3(b) show the constitution of the device of Example 4.

FIG. 3(a) is a top view of an active matrix substrate of this Example for peripheral circuits-integrated, electro-optical liquid-crystal display devices, in which are formed both an active matrix-type area image sensor circuit and an active matrix-type display circuit on the substrate.

As in FIG. 3(a), formed are an active matrix display circuit 351, peripheral circuits 352 for driving the circuit 351, an active matrix-type area image sensor circuit 353, and peripheral driver circuits 354 for driving the circuit 353, all on the insulating surface of a substrate 301.

Figure 3B:
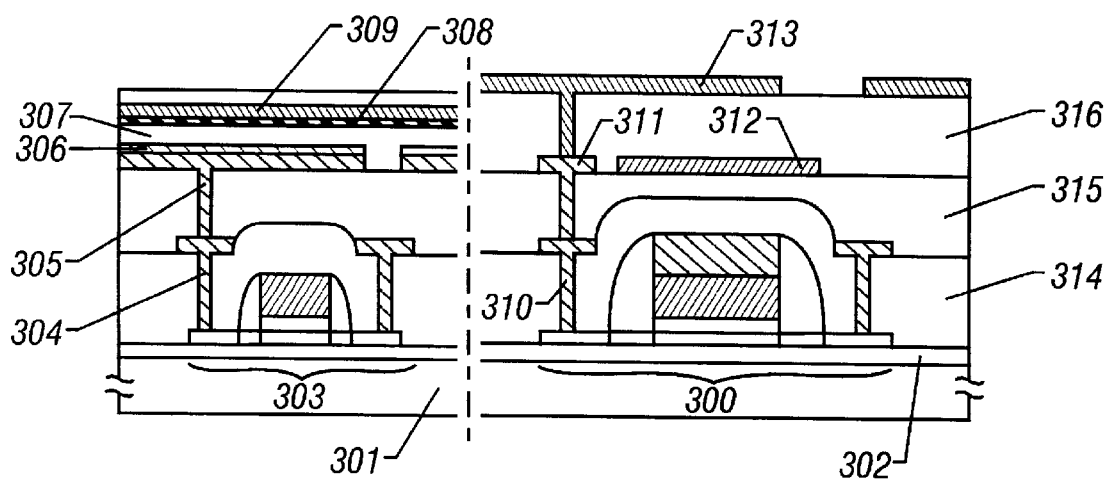
Figure 4A:
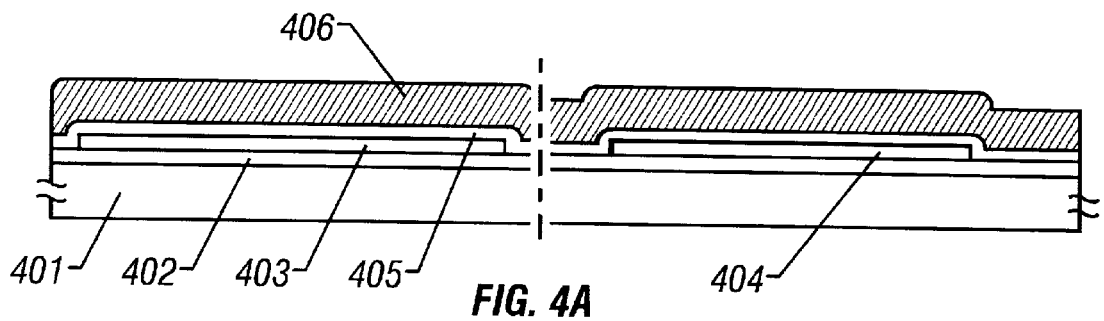
FIG. 4(A) to FIG. 4(C) show a general process for producing conventional integrated circuits.
Figure 4B:
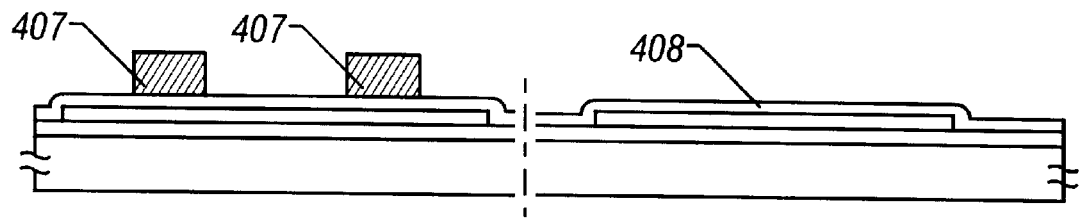
Figure 4C:
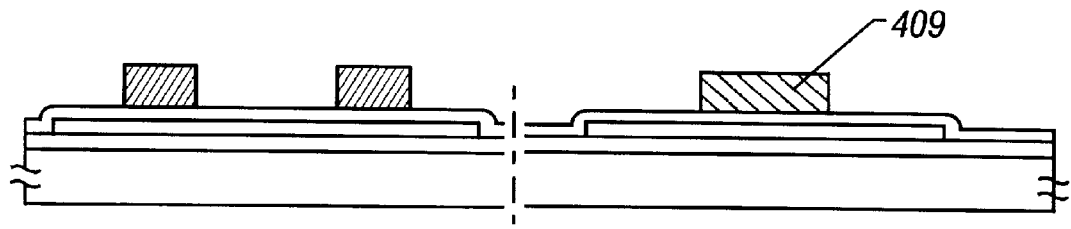

FIG. 3(b) is referred to, in which TFT 303 having a crystalline silicon gate electrode is a pixel switching element in the active matrix-type area image sensor circuit 353 in the integrated active matrix circuit of this Example.

The constitution of the peripheral driver circuits 352 and 354 in FIG. 3(a) is not specifically indicated herein. In those circuits in this Example, employable are the crystalline silicon gate TFT illustrated in Example 1.

In FIG. 3(b), TFT 300 having a metal-silicon gate electrode is a pixel switching element in the active matrix-type display circuit 351 in the integrated active matrix circuit of this Example.

As in FIG. 3(b), both TFT 303 having a crystalline silicon gate electrode and TFT 300 having a metal-silicon gate electrode are formed on the insulating surface of the substrate 301 via an underlying film 302 therebetween.

The constitution of TFT 303 having a crystalline silicon gate electrode is the same as that of TFT 151 in Example 1. The constitution of TFT 300 having a metal-silicon gate electrode is the same as that of TFT 153 in Example 1. Therefore, those TFT 303 and 300 can be formed in the same manner as in Example 2.

TFT 303 having a crystalline silicon gate electrode comprises a drain electrode 304 as formed via an interlayer insulating film 314, and the electrode 304 is connected with a pixel electrode 305 via an interlayer insulating film 315 therebetween.

On the pixel electrode 305, formed is a laminate of a photoelectric transfer layer composed of an n-type amorphous silicon layer 306, an i-type amorphous silicon layer 307, a p-type amorphous silicon layer 308 and a transmissive light-accepting electrode 309. On the light-accepting electrode 309, formed is a planarizing, interlayer insulating film 316.

TFT 300 having a metal-silicon gate electrode comprises a drain electrode 310 as formed via the interlayer insulating film 314, and the electrode 310 is connected with a relay electrode 311 via an interlayer insulating film 315 therebetween. The relay electrode 311 is connected with a pixel electrode 313 via an interlayer insulating film 316 therebetween. The pixel electrode 313 is for applying an electric field to liquid crystal material. Between the interlayer insulating films 315 and 316, provided is a light-shielding film (black matrix).

In the device of this Example, which comprises the active matrix display circuit and the area image sensor circuit both formed on one and the same substrate as so illustrated herein, any gate signal delay through the active matrix display circuit is prevented. In this, in addition, the fine wiring patterns in the area image sensor circuit can be formed in a simplified process that comprises a reduced number of working steps.

Accordingly, as compared with that for conventional image sensor-integrated display panels in which the gate electrodes are all formed from a metal such as aluminum or the like, the power for the device of this Example is reduced since the power to be consumed by the image sensor part in the device is small.

EXAMPLE 5

This Example is to show various applications of the active matrix-type, electro-optical liquid-crystal display device of Example 1. The present invention is applicable to various electronic appliances including, for example, video cameras, still cameras, projectors, head-mount displays, car navigations, personal computers, portable information terminals (mobile computers, portable telephones, etc.), etc.

Outlines of some examples of those electronic appliances are graphically shown in FIG. 5(A) to FIG. 5(F).

FIG. 5(A) is a mobile computer. Its body 2001 is provided with a camera member 2002, an image-receiving member 2003, a control switch 2004, and a liquid-crystal display device 2005.

FIG. 5(B) is a head-mount display. Its body 2101 is provided with a pair of liquid-crystal display devices 2102, and a band member 2103 by which the body is fixed on the head. One of the pair of liquid-crystal display devices displays an image for the left eye, while the other displays another image for the right eye. Visually receiving the both images via an optical system, the user could see a large-area picture just before its eyes.

FIG. 5(C) is a portable telephone. Its body 2201 is provided with a voice-outputting member 2202, a voice-inputting member 2203, a liquid-crystal display device 2204, a control switch 2205, and an antenna 2206.

FIG. 5(D) is a video camera. Its body 2301 is provided with a reflection-type liquid-crystal display device 2302, a voice-inputting member 2303, a control switch 2304, a battery 2305, and an image-receiving member 2306.

In the electro-optical liquid-crystal display devices as completed according to the technique of the invention disclosed herein, such as that demonstrated in Example 1, the power to be consumed by the peripheral driver circuits is small. Therefore, the devices are favorable to portable appliances to be driven by batteries, such as those of FIG. 5(A) to FIG. 5(D).

FIG. 5(E) is a rear projector. The light having been emitted by the light source 2402 disposed inside the body 2401 is reflected and modulated in the pixel area of the reflection-type liquid-crystal display device 2403. The reflected light is, having been reflected on the mirrors 2404 and 2405, projected on the screen 2406 to give a picture thereon.

FIG. 5(F) is a front projector. In its body 2501, the light from the light source 2502 is modulated in the transmission-type liquid-crystal display device 2503. The transmitted light is, having passed through the optical system 2504, projected on the screen 2505 to give a picture thereon.

EXAMPLE 6

This Example is to show various applications of the image sensor-integrated liquid-crystal panel of Example 4, which has the active matrix-type display circuit and the area image sensor circuit both formed on one and the same substrate. Outlines of some examples of electronic appliances of this Example are graphically shown in FIG. 6(A) to FIG. 6(C).

The liquid-crystal panel of Example 4 comprises a light-receiving region having an image pick-up function and a display region as integrated on one and the same substrate. Therefore, this is favorable to the display member for communication facilities for video conference systems, picturephones, internetting terminals, personal computers, etc. For example, the user can transmit a picture of its own image having been taken in the light-receiving matrix of the user's device to the terminal of the interacting party's device, while seeing the interacting party's image having been transmitted from the terminal of the interacting party and displayed on the user's display. In that manner, the device of Example 4 realizes two-way communication of dynamic images.

One example of the electronic appliances of that type is in FIG. 6(A), which shows an outline of a notebook-type personal computer 2030 having a liquid-crystal panel 2031. In FIG. 6(A), 2032 is an area image sensor.

Another example is in FIG. 6(B), which shows a picture-phone 2010. In FIG. 6(B), 2011 is a liquid crystal panel, and 2012 is an area image sensor. The user can communicate with the interacting person, while freely taking a picture of its own image in the area image sensor 2012 and transmitting it to the device of the interacting person and while, at the same time, seeing the picture of the interacting person as displayed on the liquid-crystal panel of the user's device.

FIG. 6(C) shows a handwriting-inputting type, portable information terminal device 2020, in which 2021 is a liquid-crystal panel, and 2022 is an area image sensor. Via the area image sensor 2022, character and image information is inputted into the device from papers or the like, and displayed on the liquid-crystal panel 2021, or is stored in the device.

In the image sensor-integrated liquid-crystal panel of Example 4, the power to be consumed by the area image sensor circuit is much more reduced than that in conventional ones where all wiring patterns are made of metal. Therefore, the present invention is favorable to electronic appliances to be driven by batteries, such as those of FIG. 6(A) to FIG. 6(C).

According to the invention disclosed herein, both circuits where the gate electrodes are required to be in fine patterns and circuits where the gate electrodes are required to have low electric resistance can be separately formed on one and the same substrate in a simplified process that comprises a reduced number of working steps. The invention provides semiconductor integrated circuits of high quality.

According to the invention disclosed herein, it is possible to form active matrix-type display circuits and other circuits, such as control circuits, MPU (micro-processing units), memories (DRAM, SRAM, EPROM, EEPROM, flash memories, ferroelectric memories (FRAM)), image sensors, input/output circuits, A (analog)/D (digital) or D/A conversion circuits, etc., all on one and the same substrate, and the devices thus produced are power-saving ones having a high degree of integration and capable of displaying good images.

The invention realizes multi-functional intelligent panels, system-on-glass devices and system-on-chip devices, in which various functional facilities for image displaying, data inputting/outputting, data computing, memory, control, image reading-out, voice inputting/outputting, wave sending/receiving and others are compounded and integrated on one and the same substrate.

The constitution of the gate electrodes for use in the invention is herein specifically illustrated for the devices comprising thin film transistors, but should not be limited to only the illustrated embodiments. The gate electrodes are applicable to any and every insulating gate-type, field effect transistors. Therefore, the constitution of the gate electrodes disclosed herein is also effectively applicable to MOS transistors comprising single-crystal silicon substrates, SOI (silicon-on-insulator) substrates, etc.

In those cases, the conductivity of the gate electrodes in the transistors that constitute active matrix display circuits is increased, whereby gate signals through the circuits are prevented from being delayed or attenuated and the display devices produce good images. According to the invention, it is easy to realize the constitution of the specific gate electrodes in plural transistors in a simple process comprising a reduced number of working steps.

While the invention has been described in detail and with reference to specific embodiments thereof, it will be apparent to one skilled in the art that various changes and modifications can be made therein without departing from the spirit and scope thereof.

What is claimed is:

1. A semiconductor integrated circuit having a peripheral circuit and an active matrix display circuit formed over a same substrate, said integrated circuit comprising:
   at least one transistor in said peripheral circuit having a gate electrode of crystalline silicon in a single layer structure; and
   at least one transistor in said active matrix display circuit having a gate electrode with a first layer and a second layer, said first layer comprising crystalline silicon, and said second layer comprising a substance having a higher electric conductivity than said crystalline silicon,
   where said second layer is formed over at least part of said first layer, and
   where the width of the gate electrode in said peripheral circuit is smaller than that of the second layer of the gate electrode in said active matrix display circuit.

2. A circuit according to claim 1, wherein a driving voltage for the active matrix display circuit is higher than that for the peripheral circuit.

3. A circuit according to claim 1, wherein said peripheral circuit is an area image sensor circuit.

4. A circuit according to claim 1, wherein the crystalline silicon in said peripheral circuit and said active matrix circuit contains an impurity capable of imparting conductivity thereto.

5. A semiconductor device having at least a first thin film transistor and a second thin film transistor on an insulating surface, said first thin film transistor comprising:
   a first semiconductor layer and a first gate electrode adjacent to said first semiconductor layer with a first gate insulating film interposed therebetween, said first gate electrode having a single layer comprising silicon; and
   said second thin film transistor comprising:
   a second semiconductor layer and a second gate electrode adjacent to said second semiconductor layer with a second gate insulating film interposed therebetween;
   said second gate electrode having a first layer comprising silicon and a second layer comprising metal, said first layer being adjacent to said second layer;
   wherein a side wall spacer is formed on a side of at least one of said first and second gate electrodes; and
   wherein at least one LDD region is formed in at least one of said first and second semiconductor layers under said side wall spacer.

6. A semiconductor device according to claim 5, wherein an edge of said gate electrode and a boundary between said LDD region and said channel forming region are coextensive.

7. A semiconductor device according to claim 5, wherein the silicon in said first layer is crystalline silicon containing phosphorus.

8. A semiconductor device according to claim 5, wherein said first layer is silicide.

9. A semiconductor device according to claim 5, wherein the metal in said second layer of said material comprising metal of the gate electrode is selected from aluminum, tantalum, molybdenum, tungsten, copper or a combination thereof.

10. A semiconductor device according to claim 5, wherein the metal of the gate electrode comprises tungsten.

11. A semiconductor device according to claim 5, wherein said side wall spacer comprises silicon oxide.

12. A semiconductor device according to claim 5, wherein said semiconductor device is a display device for a video camera.

13. A semiconductor device according to claim 5, wherein said semiconductor device is a display device for a still camera.

14. A semiconductor device according to claim 5, wherein said semiconductor device is a display device for a projector.

15. A semiconductor device according to claim 5, wherein said semiconductor device is a display device for a head-mount display.

16. A semiconductor device according to claim 5, wherein said semiconductor device is a display device for a car navigation device.

17. A semiconductor device according to claim 14, wherein said semiconductor device is an electroluminescent display device.

18. An active matrix device having an insulating surface, said device comprising:
   a semiconductor layer formed over said insulating surface;
   a source region, a channel forming region and a drain region formed in said semiconductor layer;
   a gate insulating film formed over at least said channel forming region;
   a gate electrode formed over said gate insulating film, said gate electrode having a first layer comprising silicon and a second layer comprising metal, said first layer being adjacent to said second layer;
   a side wall spacer formed on a side of said gate electrode;
   an LDD region formed in said semiconductor layer under said side wall spacer;
   a first interlayer insulating film formed over said gate electrode and said LDD region;
   at least one electrode formed over said first interlayer insulating film in contact with one of said source and drain regions;
   a second interlayer insulating film formed over said electrode in contact with one of said source and drain regions, and said first interlayer insulating film; and
   a pixel electrode formed over said second interlayer insulating film and electrically connected with the other one of said source and drain regions.

19. An active matrix display device according to claim 18, wherein an edge of said gate electrode and a boundary between said LDD region and said channel forming region are coextensive.

20. An active matrix display device according to claim 18, wherein the silicon in said first layer is crystalline silicon containing phosphorus.

21. An active matrix display device according to claim 18, wherein the silicon in said first layer is a silicide.

22. An active matrix display device according to claim 18, wherein the metal in said second layer of the gate electrode is selected from aluminum, tantalum, molybdenum, tungsten, copper or a combination thereof.

23. An active matrix display device according to claim 18, wherein the metal of the gate electrode comprises tungsten.

24. An active matrix display device according to claim 18, wherein said side wall spacer comprises silicon oxide.

25. An active matrix display device according to claim 18, wherein said active matrix display device is a display device for a video camera.

26. An active matrix display device according to claim 18, wherein said active matrix display device is a display device for a still camera.

27. An active matrix display device according to claim 18, wherein said active matrix display device is a display device for a projector.

28. An active matrix display device according to claim 18, wherein said active matrix display device is a display device for a head-mount display.

29. An active matrix display device according to claim 18, wherein said active matrix display device is a display device for a car navigation device.

30. An active matrix display device according to claim 28, wherein said active matrix display device is an electroluminescent display device.

31. An image sensor integrated panel having at least a first thin film transistor and a second thin film transistor on an insulating surface, wherein said first thin film transistor comprises:
   a first semiconductor layer and first gate electrode adjacent to said first semiconductor layer with a first gate insulating film therebetween, said first gate electrode having a single layer comprising silicon; and
   said second thin film transistor comprising:
      a second semiconductor layer and second gate electrode adjacent to said second semiconductor layer with a second gate insulating film therebetween;
   said second gate electrode having a first layer comprising silicon and a second layer comprising metal, said first layer being adjacent to said second layer;
   wherein a side wall spacer is formed on a side of at least one of said first and second gate electrodes; and
   wherein an LDD region layer is formed in at least one of said first and second semiconductor layers under said side wall spacer.

32. An image sensor integrated panel according to claim 31, wherein an edge of said gate electrode and a boundary between said LDD region and said channel forming region are coextensive.

33. An image sensor integrated panel according to claim 31, wherein the silicon in said first layer is crystalline silicon containing phosphorus.

34. An image sensor integrated panel according to claim 31, wherein said first layer is silicide.

35. An image sensor integrated panel according to claim 31, wherein the metal in said second layer of the gate electrode is selected from aluminum, tantalum, molybdenum, tungsten, copper or a combination thereof.

36. An image sensor integrated panel according to claim 31, wherein the metal of the gate electrode comprises tungsten.

37. An image sensor integrated panel according to claim 31, wherein said side wall spacer comprises silicon oxide.

38. An image sensor integrated panel according to claim 31, wherein said image sensor integrated panel comprises a display device for a video camera.

39. An image sensor integrated panel according to claim 31, wherein said image sensor integrated panel comprises a display device for a still camera.

40. An image sensor integrated panel according to claim 31, wherein said image sensor integrated panel comprises a display device for a projector.

41. An image sensor integrated panel according to claim 31, whereon said image sensor integrated panel comprises a display device for a head-mount display.

42. An image sensor integrated panel according to claim 31, wherein said image sensor integrated panel comprises a display device for a car navigation device.

43. An image sensor integrated panel according to claim 40, wherein said image sensor integrated panel comprises an electroluminescent display device.

44. An image sensor integrated panel according to claim 31, wherein said image sensor integrated panel comprises a video conference system.

45. An image sensor integrated panel according to claim 31, wherein said image sensor integrated panel comprises a picture-phone.

46. An image sensor integrated panel according to claim 31, wherein said image sensor integrated panel comprises an internet terminals.

47. An image sensor integrated panel according to claim 31, wherein said image sensor integrated panel comprises a personal computer.

48. An image sensor integrated panel according to claim 31, wherein said image sensor integrated panel comprises a handwriting-inputting type portable information terminal device.

49. A liquid crystal panel having a substrate on which a light receiving region with an image pick-up function and a display region are integrated, said display region includes at least a first and a second thin film transistors,
   said first thin film transistor comprising a first semiconductor layer and a first gate electrode adjacent to said first semiconductor layer with a first gate insulating film interposed therebetween, said first gate electrode having a silicon containing layer; and
   said second thin film transistor comprising a second semiconductor layer and a second gate electrode adjacent to said second gate semiconductor layer with a second gate insulating film interposed therebetween,
   said second gate electrode having a a silicon containing layer and a metal containing layer thereon;
   wherein a side wall spacer is formed on a side of at least one of said first and second gate electrodes; and
   wherein an LDD region is formed in said first and second semiconductor layers under said side wall spacer.

50. A liquid crystal panel according to claim 49, wherein an edge of said gate electrode and a boundary between said LDD region and said channel forming region are coextensive.

51. A liquid crystal panel according to claim 49, wherein said silicon containing layer is crystalline silicon containing phosphorus.

52. A liquid crystal panel according to claim 49, wherein said silicon containing layer is silicide.

53. A liquid crystal panel according to claim 49, the metal containing layer of the gate electrode is selected from aluminum, tantalum, molybdenum, tungsten, copper or a combination thereof.

54. A liquid crystal panel according to claim 49, the metal containing layer of the gate electrode comprises tungsten.

55. A liquid crystal panel according to claim 49, wherein said side wall spacer comprises silicon oxide.

56. A liquid crystal panel according to claim 49, wherein said liquid crystal panel comprises a display device for a video camera.

57. A liquid crystal panel according to claim 49, wherein said liquid crystal panel comprises a display device for a still camera.

58. A liquid crystal panel according to claim 49, wherein said liquid crystal panel comprises a display device for a projector.

59. A liquid crystal panel according to claim 49, wherein said liquid crystal panel comprises a display device for a head-mount display.

60. A liquid crystal panel according to claim 49, wherein said liquid crystal panel comprises a display device for a car navigation device.

61. A liquid crystal panel according to claim 49, wherein said liquid crystal panel comprises an electroluminescent display device.

62. A liquid crystal panel according to claim 49, wherein said liquid crystal panel comprises a display device for a video conference system.

63. A liquid crystal panel according to claim 49, wherein said liquid crystal panel comprises a display device for a picture-phone.

64. A liquid crystal panel according to claim 49, wherein said liquid crystal panel comprises a display device for an internet terminals.

65. A liquid crystal panel according to claim 49, wherein said liquid crystal panel comprises a display device for a personal computer.

66. A liquid crystal panel according to claim 49, wherein said liquid crystal panel comprises a display device for a handwriting-inputting type portable information terminal device.

67. A semiconductor device having a peripheral circuit and an active matrix display circuit on an insulating surface, said semiconductor device comprising:

said peripheral circuit comprising at least a thin film transistor having a gate electrode comprising single layer;

said active matrix display circuit comprising at least a thin film transistor having a gate electrode comprising a first and a second layer.

68. A semiconductor device according to claim 67 wherein said semiconductor device is a display device selected from the group consisting of a video camera, a still camera, a projector, a head-mount display, car navigation device.

69. A semiconductor device according to claim 67 wherein said single layer and said first layer comprises a material selected from silicide, crystalline silicon containing phosphorus.

70. A semiconductor device according to claim 67 wherein said second layer comprises a material selected from the group consisting of aluminum, tantalum, molybdenum, tungsten, copper or a combination thereof.

71. A semiconductor device having at least a first thin film transistor and a second thin film transistor, said semiconductor device comprising;

said first thin film transistor having a gate electrode comprising single layer; and said second thin film transistor having a gate electrode comprising a first and a second layer;

wherein said second thin film transistor has a LDD region.

72. A semiconductor device according to claim 71 wherein said semiconductor device is a display device selected from the group consisting of a video camera, a still camera, a projector, a head-mount display, car navigation device.

73. A semiconductor device according to claim 71 wherein said single layer and said first layer comprises a material selected from silicide, crystalline silicon containing phosphorus.

74. A semiconductor device according to claim 71 wherein said second layer comprises a material selected from the group consisting of aluminum, tantalum, molybdenum, tungsten, copper or a combination thereof.

* * * * *